United States Patent [19]

Schepis et al.

[11] Patent Number: 5,485,032
[45] Date of Patent: Jan. 16, 1996

[54] ANTIFUSE ELEMENT WITH ELECTRICAL OR OPTICAL PROGRAMMING

[75] Inventors: Dominic J. Schepis; Kris V. Srikrishnan, both of Wappingers Falls; Seshadri Subbanna, Hopewell Junction; Manu J. Tejwani, Yorktown Heights, all of N.Y.

[73] Assignee: International Business Machines Corporation, Armonk, N.Y.

[21] Appl. No.: 355,206

[22] Filed: Dec. 8, 1994

Related U.S. Application Data

[60] Continuation of Ser. No. 182,259, Jan. 14, 1994, abandoned, which is a division of Ser. No. 996,767, Dec. 18, 1992, Pat. No. 5,314,840.

[51] Int. Cl.⁶ ..................................................... H01L 29/00
[52] U.S. Cl. .......................................... 257/530; 257/765
[58] Field of Search ...................................... 257/530, 529, 257/765

[56] References Cited

U.S. PATENT DOCUMENTS

| | | | |
|---|---|---|---|
| 3,649,882 | 3/1972 | Hoffman et al. | 257/591 |
| 3,725,743 | 4/1973 | Murayama | 257/750 |
| 4,177,475 | 12/1979 | Holmberg. | |
| 4,499,557 | 2/1985 | Holmberg et al.. | |
| 4,585,490 | 4/1986 | Raffel et al. | 148/1.5 |
| 4,646,266 | 2/1987 | Ovshinsky et al.. | |
| 4,740,485 | 4/1988 | Sharpe-Geisler. | |
| 4,814,853 | 3/1989 | Uchida | 257/530 |
| 4,823,181 | 4/1989 | Mohsen et al.. | |
| 4,899,205 | 2/1990 | Hamdy et al.. | |
| 4,943,538 | 7/1990 | Mohsen et al.. | |
| 5,066,998 | 11/1991 | Fischer et al.. | |
| 5,087,589 | 2/1992 | Chapman et al.. | |
| 5,095,362 | 3/1992 | Roesner | 257/330 |
| 5,134,457 | 7/1992 | Hamdy et al. | 257/530 |
| 5,233,217 | 8/1993 | Dixit et al. | 257/530 |
| 5,290,734 | 3/1994 | Boardman et al. | 257/530 |
| 5,311,039 | 5/1994 | Kimura et al. | 257/50 |
| 5,314,840 | 5/1994 | Schepis et al. | 437/194 |
| 5,329,153 | 7/1994 | Dixit | 257/530 |

FOREIGN PATENT DOCUMENTS

| | | |
|---|---|---|
| 0483958 | 5/1992 | European Pat. Off.. |
| 62-76550 | 4/1987 | Japan . |
| 2-153552 | 6/1990 | Japan . |
| 4-348548 | 12/1992 | Japan . |

OTHER PUBLICATIONS

"Low Power Programming Technique Polysilicon–Resistor Fuses"; N. C. C. Lu and C. Y. Lu; IBM Technical Disclosure Bulletin, vol. 27, No. 9, Feb. 1985; pp. 5448 to 5716.

Primary Examiner—Sara W. Crane
Assistant Examiner—Courtney A. Bowers
Attorney, Agent, or Firm—Whitham, Curtis, Whitham & McGinn; Alison D. Mortinger

[57] ABSTRACT

A programmable antifuse element comprising adjacent bodies of germanium and aluminum or aluminum alloy form a low resistance connection of good mechanical and thermal properties when heated to a temperature where alloying of the aluminum and germanium occurs. Heating for the purpose of programming the antifuse element can be done by electrical resistance heating in the germanium, which may be doped to achieve a desired resistance value, or by laser irradiation. Due to the high resistance of intrinsic or lightly doped germanium, a resistance change ratio of greater than 10,000:1 is achieved.

18 Claims, 2 Drawing Sheets

ANTIFUSE ELEMENT WITH ELECTRICAL OR OPTICAL PROGRAMMING

This application is a continuation of application Ser. No. 08/182,259, filed Jan. 14, 1994, now abandoned, which was a divisional application of Ser. No. 07/996,767 filed Dec. 18, 1992, which issued on May 24, 1994 U.S. Pat. No. 5,314,840.

BACKGROUND OF THE INVENTION

1. Field of the Invention

The present invention generally relates to programmable structures for forming programmable connections in integrated circuit devices and, more particularly, to an antifuse structure for selectively forming connections between circuits and circuit elements in integrated circuit devices.

2. Description of the Prior Art

As the scale of integration has increased in the manufacture of integrated circuits, it has become economically necessary to provide redundant circuits in virtually all devices manufactured in order to preserve acceptable levels of manufacturing yield. Upon formation of the integrated circuit to certain levels of completeness, testing may be done and defective circuits disconnected by destroying a fusible link or fuse with a high level of current. A similar mechanism is employed in known "antifuses" such as that disclosed in U.S. Pat. No. 4,943,538 to Mobsen et al. where an insulator is destroyed in order to form a connection rather than to interrupt a connection, often accompanied by flow of molten conductive material at a high temperature. These practices, while widely employed have several significant drawbacks even though a substantial economic gain is realized.

The destruction of known fusible links and insulators in known antifuses inherently causes electrical, mechanical and thermal stressing of at least a portion of the integrated circuit and may also cause damage beyond the capability of current repair techniques. The thermal stressing may also initiate processes such as metal migration in other connectors or changes in transistor characteristics which compromise integrated circuit performance. Therefore, the relatively violent processes associated with fuses and, especially, antifuses may cause significant loss of manufacturing yield. Further, when the present state of the art provides only for the destruction of connections with acceptably low likelihood of chip damage, often complex arrangements may be required during integrated circuit design in order to insure that redundant structures will be connected when the fusible links are destroyed. Alternatively, redundant pinouts or address decoder modifications may be required in the same fashion that fusible links are destroyed to assure that redundant structure can be effectively and functionally substituted for the disconnected structure.

Further, electrical programming of fuses and antifuses may be difficult in some cases due to the difficulty of making connections to the integrated circuit chip to be modified. Often, different electrical connections must be made to the chip for each fuse or antifuse to be programmed. Further, to reduce the risk of damage to other circuit elements when the programmable element is destroyed, a relatively large "footprint" must be dedicated to the fuse in order to allow for temperature reduction through thermal conduction and heat dissipation in the vicinity of each fuse.

Additionally, in programming of fuses and antifuses, the process tolerances (e.g. operating margins for programming) are sufficiently small that programmable elements may not be completely destroyed when programming is done. The fuses also must be fabricated with a significant resistance and the difference in resistance between an intact fuse and a "destroyed" fuse may only be a few orders of magnitude (e.g. a factor of several hundred). Conversely, the delicacy of programmable elements in fuses and antifuses often allows programming to occur accidentally during electrical burn-in.

SUMMARY OF THE INVENTION

It is therefore an object of the present invention to provide an antifuse element which is electrically or optically programmable connection between conductors of an integrated circuit device.

It is another object of the invention to provide an electrically or optically programmable connection structure of small lateral dimensions.

It is a further object of the invention to provide an electrically or optically programmable connection structure which reliably exhibits a change of resistance, when programmed, differing by a factor of ten thousand, or more, in comparison to an unprogrammed connection structure in accordance with the invention.

In order to accomplish these and other objects of the invention, an integrated circuit is provided including a connector structure which includes a body of germanium adjacent a body containing aluminum.

In accordance with another aspect of the invention, an antifuse element is provided comprising at least one body containing aluminum and a body of germanium adjacent said body containing aluminum.

In accordance with a further aspect of the invention, a method of fabricating a programmable connection is provided including the steps of depositing a body containing aluminum, depositing a body of germanium adjacent the body of aluminum, and heating at least a portion of each of the bodies of germanium and aluminum to a temperature of approximately 450° C. with electro-magnetic radiation.

In accordance with yet another aspect of the invention, a method of fabricating a programmable connection is provided including the steps of depositing a body containing aluminum, depositing a body of germanium adjacent the body of aluminum, doping the body of germanium to reach a predetermined resistance value range, and alloying at least a portion of the body of germanium with at least a portion of the body containing aluminum by electrical resistance heating of the body of germanium.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
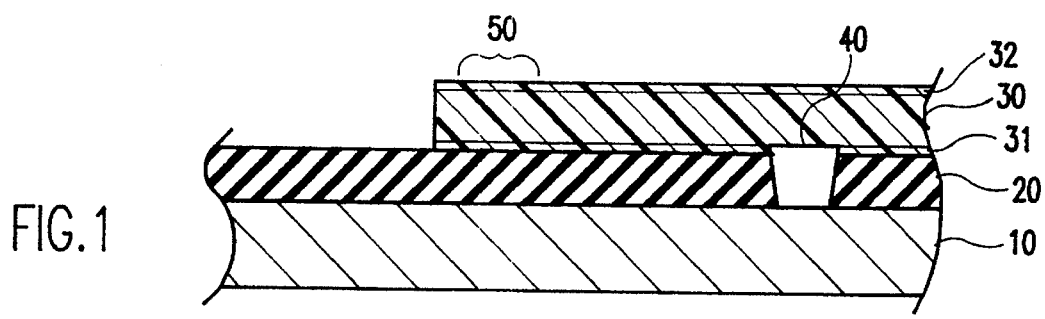
FIGS. 1, 2, 3 and 4 illustrate formation of an antifuse in accordance with the invention.
Figure 2:
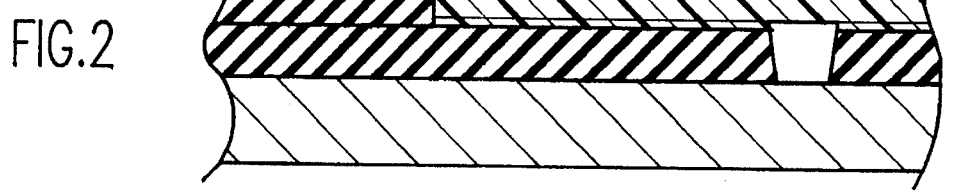

Referring now to the drawings, and more particularly to FIG. 1, an early stage of the fabrication of the antifuse 100 (FIG. 3) is shown. Layer 10 represents a plurality of layers which form an integrated circuit comprising at least two transistors and is referred to hereinafter as a "masterslice". The assumption of at least two transistors is intended to indicate that the present invention is applicable to integrated circuits of any scale of integration or integration density in which redundant circuits exist and which are to be selectively connected to contacts or other circuits to improve manufacturing yield of the overall manufacturing process if one or more circuits are found, upon testing to be of questionable operability or stability. In practice, the formation of such redundant circuits is generally employed only with large scale integrated circuits, but, in principle, the present invention could be applied to any device in which selective connections for programming were to be carried out. Therefore, the invention should not be considered as limited to large scale integrated circuits but is also applicable to transistors and such other circuits as read-only memories and decoders.

On the surface of the masterslice 10, it is also assumed that an oxide insulating layer 20 and a metal conductor 30 are formed in sequence. For improved adhesion between layers metal nitride layers 31, 32 are also shown but are not particularly important to the practice of the invention. Preferred materials for conductor 30 are aluminum and aluminum-copper alloys which may be further alloyed with titanium, nickel or cobalt, such as Al—Cu/Ti or Al—Cu—Ge/Ti. Alternatively, aluminum-silicon alloys can be employed in the practice of the invention. The principal requirement is that the conductor or other body of material adjacent to a body of germanium contain and be able to serve as a source of aluminum for alloying.

The conductor 30 is preferably formed by a blanket deposition followed by patterning by etching. However, the technique of conductor formation is not critical to the invention. The conductor layer will be connected to some point (e.g. connection pad) of the masterslice 10 in order to form a connection to some portion of the integrated circuit therein. The construction of this connection 30 to masterslice 10 through insulator 20 is not important to the practice of the invention. However, a stud 40 of known construction would preferably be used for the purpose. It should be noted, however, that the invention can be applied to any stud layer and could, for example, be carried out at location 40 in the same manner as will now be described for location 50.

The basic object of any programmable connection structure, such as the fuses known in the prior art, is to form a connection structure extending at least to a point where it is accessible by another conductor in the same or a different layer and which, after formation allows change of the conductivity characteristics of the structure by a later operation. In accordance with the invention, a further insulative oxide layer 60 is applied over the termination of conductor 30 and planarized to accept deposition of another conductor. The illustrated termination of connection 30 is to be regarded as symbolic of a terminal node at which a connection can be made to a portion of an integrated circuit and actual termination, as shown, is not necessary.

Figure 3:
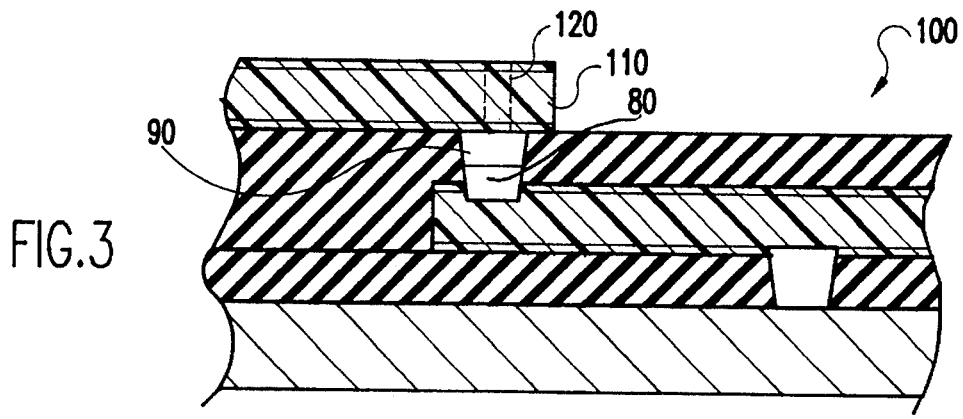

The oxide is then patterned, preferably with a mask, not shown, and a via is etched through the oxide and preferably, if economically possible, to a significant fraction of the thickness of conductor 30. Then, as shown in FIG. 3 the via is partially or completely filled with intrinsic (e.g. undoped) germanium, preferably by selective germanium growth within the vias with nucleation provided by aluminum on the bottoms of the vias. Chemical vapor deposition using germane ($GeH_4$) or di-germane ($Ge_2H_6$) or some similar gas at a temperature of about 350° C. and other techniques such as collimated sputtering and electron cyclotron resonant (ECR) sputtering are also suitable. The antifuse in accordance with the invention could be considered to be complete at this point and, as will be discussed below, could be programmed at this point in the process if programming is to be done by optical techniques (that is, before electrical connections 110, allowing electrical programming, are formed on the upper side). However, it should be noted that later programming by optical means is still available even after a the formation of a tungsten cap or a reflective aluminum connection since it is not necessary that optical energy reach the antifuse structure but only that heat be conducted thereto. Therefore, even if a reflective aluminum connection is applied over the antifuse structure, a dark, light absorptive layer of, say, a refractory material could be applied thereover at the antifuse location. It should also be noted in this regard that melting of the germanium and/or aluminum is not necessary but only the heating to a temperature where a solid state diffusion reaction will occur fairly rapidly.

It is somewhat preferable to only partially fill via 70 to reduce the amount of energy (e.g. heat) which must be applied during programming of the antifuse. However, filling must be carried out to a significant height above the surface of conductor 30 and into the thickness of oxide 60 in order to achieve a relatively large resistance (e.g. generally in the range of 1K to 10K Ohms and preferably about 5K Ohms). Some light doping of the germanium may be necessary to facilitate electrical heating and to achieve a resistance near 5K Ohms if filling is done to a greater degree. For example, a length of Germanium in the range of 1000 to 3000 Angstroms is preferred to minimize and resistance change due to the heat budget of other process steps which may cause slight diffusion of aluminum. This length would require a dopant concentration in the range of 10– to 10≠atoms per cubic centimeter to achieve an appropriate resistance. In comparison, if intrinsic germanium having a high specific resistance of 50 Ohm cm. at room temperature were to be used, a length limit of about 100 Angstroms would be imposed since greater lengths and resistance would preclude drawing enough current for electrical resistance heating to occur with acceptable differentiation from other elements. At the same time, the doping levels of the germanium should be small enough and the resulting resistance high enough (e.g. also near 5K Ohms) to prevent programming temperatures from being reached during application of burn-in voltages to the integrated circuit.

The remainder of the via 90 is preferably filled with tungsten which can be deposited at the same temperature as the germanium. Therefore the two depositions can be achieved by a single tool. Alternatively, the entire via can be filled with intrinsic germanium if optical programming is intended or with impurity doped germanium if suitably doped to allow significant differential resistance heating during electrical programming at voltages that can be withstood by other portions of the integrated circuit. However, extended lengths of germanium may cause difficulty (e.g. extended heating time) in achieving sufficient diffusion, particularly if intrinsic germanium is used.

Other via structures can achieve the same advantages for optical programming, however, with reduced heat requirements compared with a germanium filled via and while retaining the ability to be electrically programmed. For example, for optical programming, it would be preferable to fill volume 80 with aluminum and complete filling of the via by deposition of germanium in volume 90. In this case, the thickness of the germanium should also be chosen to achieve a resistance near 5K Ohms. With this construction, the germanium would remain at the surface in order to be "visible" to laser light used for programming. This type of structure including a body of aluminum or aluminum-containing material independent of the conductor but adjacent the germanium body would also be useful where a higher melting point metal such as copper or a metal that alloys less readily with germanium were to be used for conductor 30. In this latter case, a layer of tungsten can be applied after the germanium, if desired.

After the via structure is completed by one of the above alternative techniques in accordance with the invention, a further connection 110 is preferably added to the antifuse and a passivation layer applied. For optical programming, an aperture 120 may also be provided in the connection 110, coincident with a portion of the stud location. However, it may mot be feasible to form an optically effective hole which does not reduce connection cross-sectional area of the conductor and thus provision of a material to increase absorption of light energy, such as a black or dark refractive material, referred to above, and reliance on heat conduction through the connection 110 is preferred. The addition of a quartz/silicon passivation layer does not seriously affect later optical programming since eledtromagnetic radiation, preferably infra-red light from a carbon dioxide laser, will penetrate insulating layers of quartz or polyimide for depths likely to be encountered. Alternatively, if the entire chip is heated to about 350°–380° C., the amount of additional laser heating required for programming is relatively small and optical access is less critical and possibly unnecessary.

Figure 4:
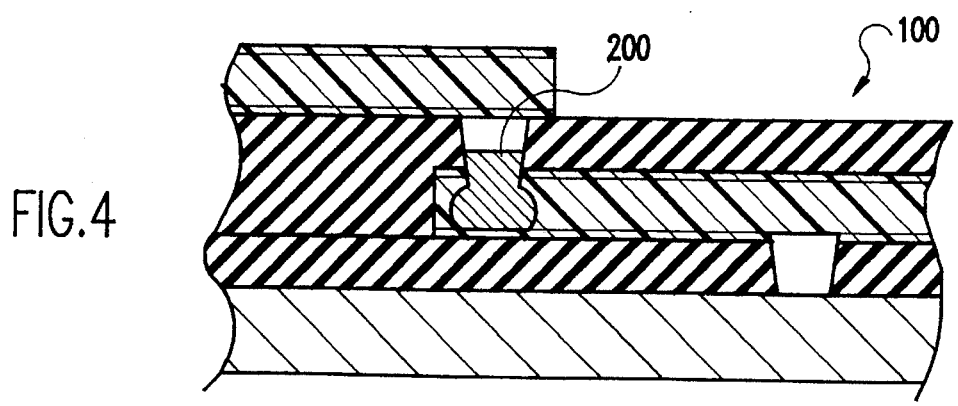
Figure 5:
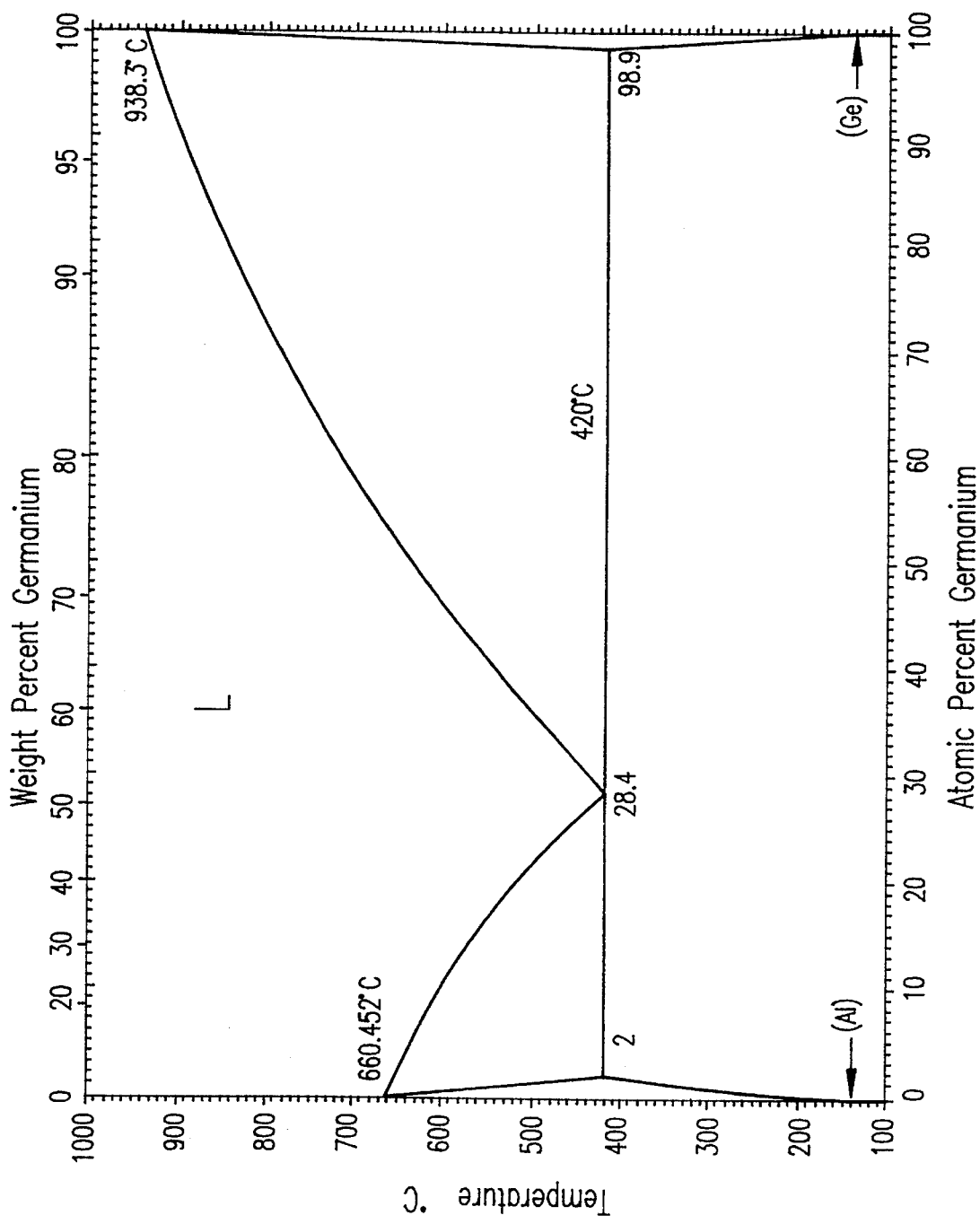
FIG. 5 is a germanium-aluminum alloy phase diagram illustrative of the principles of the invention.

With brief reference now to FIG. 5, showing a phase diagram for alloys of germanium and aluminum it is seen that at a temperature of only slightly above 420° C., stable alloys of aluminum and germanium are formed by dissolution of germanium in aluminum, all of which are of low resistance. A specific resistance for eutectic aluminum-germanium alloys as low as 6 μOhms-cm. has been reported in the literature. A typical resistance of 0.2 Ohms for a 0.5×0.5 micron stud yields a very large resistance change ratio (e.g. 25,000:1) relative to an as-formed resistance of 5K Ohms. (For this reason, it is preferred but not at all critical to adjust the relative volumes of 80 and 90 and/or adjust the rate of electrical or optical heating relative to heat conduction in an aluminum-containing conductor adjacent the germanium to approximate the proportions of aluminum and germanium in a eutectic alloy since eutectic alloys will exhibit maximum thermal stability.) Therefore, a connection can selectively be made through the antifuse by selective heating thereof to form an alloy plug such as at 200, as shown in FIG. 4 (or throughout volume 90, if germanium is initially deposited in that volume rather than in volume 80). The alloy plug will be principally composed of eutectic alloy but the specific alloy is not critical since all are highly conductive. All of these alloys are believed to be highly stable mechanically by extrapolation from the fact that alloying of aluminum with silicon is a known technique to prevent "spiking" of junctions (e.g. diffusion of spikes of aluminum into silicon when aluminum contacts are applied) in transistors.

This type of programmable structure has numerous advantages which may not be immediately evident. First, the alloy plug is highly stable and can thus be used in close proximity to active devices. This is also an advantage of the relatively low temperatures at which alloying may be made to occur. Second, since no fuse is "blown" and the programming process is done at a relatively low temperature, there is little or no risk of damage to adjacent structures. Third, in assembly of the chip with other structures, bonding temperatures for solder reflow are limited to temperature of 400° C. and below and the antifuse is not significantly affected thereby. For example, in an extreme case a heat budget of, say, 10 hours at 400° C. would result in diffusion distance of Aluminum into Germanium of less than 300 Angstroms or about 10% of the preferred antifuse length. For electrical stressing known as burn in, voltages and currents are typically adjusted to limit chip temperatures to about 150° C., at which temperature diffusion is much more slow. Therefore, while some diffusion of aluminum into germanium may occur in an unprogrammed fuse, the large resistance change upon alloying of a plug limits the effect on the circuit since diffusion will be relatively shallow and will not greatly affect the bulk resistance of the germanium. Thus, if the resistance of the germanium is suitably controlled by dopant concentration to require a voltage above the burn-in voltage, accidental programming is extremely unlikely during eiher further processing steps or burn-in. Fourth, by allowing a connection to be made optically, alternative techniques for programming are available and electrical isolation for programming and design restrictions and modification to avoid damage to other elements of the integrated circuit from increased voltages are unnecessary. Fifth, the antifuse in accordance with the invention produces a resistance change ratio well in excess of 10,000:1 which results in much increased process latitude and tolerance during programming as well as increased reliability and repeatability. Sixth, if programming is to be done optically, doping of the germanium is unnecessary and the full specific resistance of intrinsic germanium may be exploited to achieve even higher resistance change ratios and even higher immunity to significant resistance changes due to diffusion of aluminum into germanium.

In the interest of completeness, electrical programming is preferably done with a pulse of about 5 volts (compared to an exemplary burn-in voltage of 4–4.5 volts) which produces approximately 5 mW of power dissipation. The volume of the stud and the length of the pulse should be chosen in consideration of the chip temperature (e.g. if preheated) to achieve a local temperature of about 450° C. but without significantly heating the surrounding structure. Usually, a pulse duration of a small fraction of a millisecond is appropriate. If desired, the change of resistance can be monitored and controlled in near real time by a measurement technique disclosed in U.S. patent application Ser. No. 07/996,766 (attorney's Docket Number FI9-92076), filed concurrently herewith.

In view of the foregoing, it is seen that the essence of the antifuse structure in accordance with the invention is a body of intrinsic or lightly doped germanium adjacent a body of aluminum so that solid state diffusion may take place when heat is applied. While doping may be required to achieve desired levels of power dissipation for programming by electrical resistance heating, it is not necessary to the underlying concept of the invention. Further, due to the simplicity of the structure, many other structural configurations could be employed in the practice of the invention. For example, the invention is not limited to a stud structure but could be practiced in a single layer of a device by depositing germanium between two deposits of aluminum or aluminum-containing alloy which either constitute or are bonded to conductors. Upon raising the temperature to 450° C., as above, a germanium-aluminum alloy connection will be formed in the same manner as in the stud structure. However, it is preferred to form anti-fuses at the stud level since the antifuse would have a minimized footprint on the chip, separation from other devices for heat dissipation is more easily provided and possibly more conductor length may be available for heat sinking.

Therefore, it is seen that the above-described invention provides an antifuse element which is programmable electrically, optically or a combination thereof. The antifuse element can also be of small lateral dimension and provides a high ratio of resistance change with little or no risk of damage to surrounding structures during programming or accidental programming by other processes.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An integrated circuit including at least two conductors, and a programmable connector means for selectively alloying aluminum with germanium extending between said at least two conductors, said programmable connector means including a body of germanium adjacent a body containing aluminum and forming a source of aluminum for alloying with said body of germanium.

2. An antifuse element comprising at least two conductors, and a programmable means for selectively alloying aluminum with germanium extending between said at least two conductors, said programmable means including at least one body containing aluminum and a body containing germanium adjacent said at least one body of aluminum, at least one said body containing aluminum forming a source of aluminum for alloying with said body of germanium.

3. An antifuse element as recited in claim 2, wherein said body of germanium is lightly doped.

4. An antifuse element as recited in claim 2, wherein said body of germanium is formed as a stud by deposition in a via in an insulative layer.

5. An antifuse element as recited in claim 4, further including a layer of tungsten deposited in said via.

6. An antifuse element as recited in claim 4, further including a layer of aluminum deposited in said via.

7. An antifuse element as recited in claim 2, wherein said at least one body containing aluminum is a connector.

8. An integrated circuit as recited in claim 1, wherein said body of germanium is lightly doped.

9. An integrated circuit as recited in claim 1, wherein said body of germanium is formed as a stud by deposition in a via in an insulative layer.

10. An integrated circuit as recited in claim 9, further including a layer of tungsten deposited in said via.

11. An integrated circuit as recited in claim 9, further including a layer of aluminum deposited in said via.

12. An integrated circuit as recited in claim 1, wherein said body containing aluminum is a connector.

13. An antifuse element comprising at least two conductors, a programmable connector means for selectively alloying aluminum with germanium in a via extending between said at least two conductors, said programmable connector means including a body of germanium adjacent a body containing aluminum and forming a source of aluminum for alloying with said body of germanium.

14. An antifuse element as recited in claim 13, wherein said body of germanium is lightly doped.

15. An antifuse element as recited in claim 13, wherein said body of germanium is formed as a stud by deposition in said via in an insulative layer.

16. An antifuse element as recited in claim 15, further including a layer of tungsten deposited in said via.

17. An antifuse element as recited in claim 15, further including a layer of aluminum deposited in said via.

18. An antifuse element as recited in claim 13, wherein said body containing aluminum is a connector.

* * * * *

UNITED STATES PATENT AND TRADEMARK OFFICE
CERTIFICATE OF CORRECTION

PATENT NO. : 5,485,032
DATED : January 16, 1996
INVENTOR(S) : Dominic J. Schepis et al.

It is certified that error appears in the above—identified patent and that said Letters Patent is hereby corrected as shown below:

On the cover page of the issued patent:

In the Attorney, Agent, or Firm information, please remove the name "Alison D. Mortinger" and insert --Susan M. Murray--.

Signed and Sealed this

First Day of October, 1996

Attest:

BRUCE LEHMAN

Attesting Officer

Commissioner of Patents and Trademarks